United States Patent
Carey et al.

(10) Patent No.: US 7,450,350 B2
(45) Date of Patent: Nov. 11, 2008

(54) CURRENT-PERPENDICULAR-TO-THE-PLANE (CPP) MAGNETORESISTIVE SENSOR WITH ANTIPARALLEL-PINNED STRUCTURE HAVING SEGREGATED GRAINS OF A FERROMAGNETIC MATERIAL AND ADDITIVE CU, AU OR AG

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 548 days.

(21) Appl. No.: 11/216,746

(22) Filed: Aug. 30, 2005

(65) Prior Publication Data

US 2007/0047155 A1    Mar. 1, 2007

(51) Int. Cl.
G11B 5/39    (2006.01)
(52) U.S. Cl. .................................. 360/324.11
(58) Field of Classification Search .... 360/324.1–324.2
See application file for complete search history.

(56) References Cited

U.S. PATENT DOCUMENTS

| | | | |
|---|---|---|---|
| 5,287,238 A | 2/1994 | Baumgart et al. | |
| 5,465,185 A | 11/1995 | Heim et al. | |
| 5,648,885 A | 7/1997 | Nishioka et al. | |
| 5,843,589 A | 12/1998 | Hoshiya et al. | |
| 6,741,432 B2 | 5/2004 | Pinarbasi | |
| 6,751,072 B2 | 6/2004 | Freitag et al. | |
| 6,784,509 B2 | 8/2004 | Yuasa et al. | |
| 6,816,347 B2 | 11/2004 | Koi et al. | |
| 2004/0052008 A1 | 3/2004 | Sugawara | |
| 2004/0085689 A1 | 5/2004 | Freitag et al. | |
| 2004/0228045 A1* | 11/2004 | Hasegawa et al. | 360/324.1 |

FOREIGN PATENT DOCUMENTS

JP    200216454    4/2000

OTHER PUBLICATIONS

N. Wiese et al., "Antiferromagnetically coupled CoFeB/Ru/CoFeB trilayers", Appl. Phys. Lett., vol. 85, No. 11, Sep. 13, 2004, pp. 2020-2022.

(Continued)

*Primary Examiner*—A. J. Heinz
(74) *Attorney, Agent, or Firm*—Thomas R. Berthold (57) ABSTRACT

A current-perpendicular-to-the-plane spin-valve (CPP-SV) magnetoresistive sensor has an improved antiparallel (AP) pinned structure, i.e., a structure with first (AP1) and second (AP2) ferromagnetic layers separated by a nonmagnetic antiparallel coupling (APC) layer with the magnetization directions of AP1 and AP2 oriented substantially antiparallel. The AP2 ferromagnetic layer (the layer in contact with the SV spacer layer) is an alloy of a ferromagnetic material and one or more additive elements of Cu, Au and Ag. The additive elements reduce the magnetic moment of the AP2 layer, which enables its thickness to be increased so that its magnetic moment remains close to the magnetic moment of the AP1 ferromagnetic layer. The thicker AP2 layer allows for more bulk spin-dependent scattering of electrons which increases the magnetoresistance of the sensor. An annealed AP2 layer results in more segregation of the ferromagnetic material grains and the additive element grains, and thus a further improvement in magnetoresistance as a result of more interfacial scattering of electrons.

26 Claims, 4 Drawing Sheets

OTHER PUBLICATIONS

A. Tanaka et al., "Spin-valve heads in the current-perpendicular-to-plane mode for ultrahigh-density recording", IEEE Transactions on Magnetics, 38 (1): 84-88 Part 1 Jan. 2002.

S. Dubois et al., "Evidence for a short spin diffusion length in permalloy from the giant magnetoresistance of multilayered nanowires", Phys. Rev. B 60, pp 477-484 (1999).

* cited by examiner

CURRENT-PERPENDICULAR-TO-THE-PLANE (CPP) MAGNETORESISTIVE SENSOR WITH ANTIPARALLEL-PINNED STRUCTURE HAVING SEGREGATED GRAINS OF A FERROMAGNETIC MATERIAL AND ADDITIVE CU, AU OR AG

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to a CPP sensor with an antiparallel (AP) pinned structure.

2. Background of the Invention

One type of conventional magnetoresistive sensor used as the read head in magnetic recording disk drives is a "spin-valve" (SV) sensor. A SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance.

In a magnetic recording disk drive SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor. CPP-SV read heads are described by A. Tanaka et al., "Spin-valve heads in the current-perpendicular-to-plane mode for ultra-high-density recording", *IEEE TRANSACTIONS ON MAGNETICS*, 38 (1): 84-88 Part 1 January 2002.

One type of CPP-SV sensor used in read heads includes an antiparallel (AP) pinned structure. The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's Cu spacer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. If the AP-pinned structure is the "self-pinned" type, then no pinning layer is required. In a self-pinned structure where no antiferromagnet or hard magnet pinning layer is present, the AP1 layer is in contact with a seed layer on the sensor substrate. The AP-pinned structure minimizes magnetostatic coupling between the reference layer and the CPP-SV free ferromagnetic layer. The AP-pinned structure, also called a "laminated" pinned layer, and sometimes called a synthetic antiferromagnet (SAF), is described in U.S. Pat. No. 5,465,185.

The magnetoresistance ($\Delta R/R$) of a CPP-SV read head can be increased by increasing the thickness of the reference ferromagnetic (AP2) layer to generate more electron spin-dependent scattering within the bulk of the AP2 layer. The spin-diffusion length for typical CoFe and NiFe alloys is greater than the typical thickness of AP2, which is about 15-45 Å. If AP1 and AP2 are made of the same ferromagnetic material and the thickness of AP2 is increased, the thickness of AP1 also has to be increased to cancel out the magnetic stray fields originating from the two AP layers acting on the free layer and to assure that AP1 and AP2 have similar but not equal magnetic moments. The reason for this is to keep the net magnetic moment of the AP-pinned structure small so that the magnetostatic coupling field between the pinned and free layer is small. However, increasing the magnetic moments of AP1 and AP2 will decrease the saturation field $H_s$ of the AP-pinned structure, i.e., the magnetic field where the antiparallel coupling of the APC layer is overcome and the magnetizations of AP1 and AP2 become parallel. A high $H_s$, typically more than 5 kOe, is desirable to obtain a magnetically stable sensor.

What is needed is a CPP-SV sensor with increased magnetoresistance as a result of an improved AP-pinned structure but without a reduction in saturation field.

SUMMARY OF THE INVENTION

The invention is a CPP-SV magnetoresistive sensor with an improved AP-pinned structure. In the AP-pinned structure the AP2 layer is an alloy of a ferromagnetic material and one or more additive elements of Cu, Au and Ag. The additive elements reduce the magnetic moment of the AP2 layer, which enables its thickness to be increased so that its magnetic moment remains close to the magnetic moment of the AP1 layer. The lower limit of the additive elements is about 10 atomic percent because an amount less than that does not reduce the magnetic moment of the AP2 layer enough to cause the thickness of the AP2 layer to be increased to the desired level.

The thicker AP2 layer allows for more bulk spin-dependent scattering of electrons because its thickness is closer to the full spin-diffusion length of the electrons in AP2. The increased bulk spin-dependent scattering of electrons in AP2 increases the magnetoresistance of the sensor. It has also been discovered that the use of an AP-pinned structure in a CPP-SV sensor causes a decrease in magnetoresistance which is believed due to spin scattering at the APC and AP1 interfaces and in the bulk of the AP1 layer. The use of a thicker AP2 layer also places the APC and AP1 layers farther from the free layer, which reduces this adverse effect on magnetoresistance.

In one embodiment the AP2 layer is annealed, which results in more segregation of the ferromagnetic material grains and the additive element grains, resulting in a further improvement to magnetoresistance as a result of more interfacial scattering of electrons.

For a fuller understanding of the nature and advantages of the present invention, reference should be made to the following detailed description taken together with the accompanying figures.

DETAILED DESCRIPTION OF THE INVENTION

Figure 1:
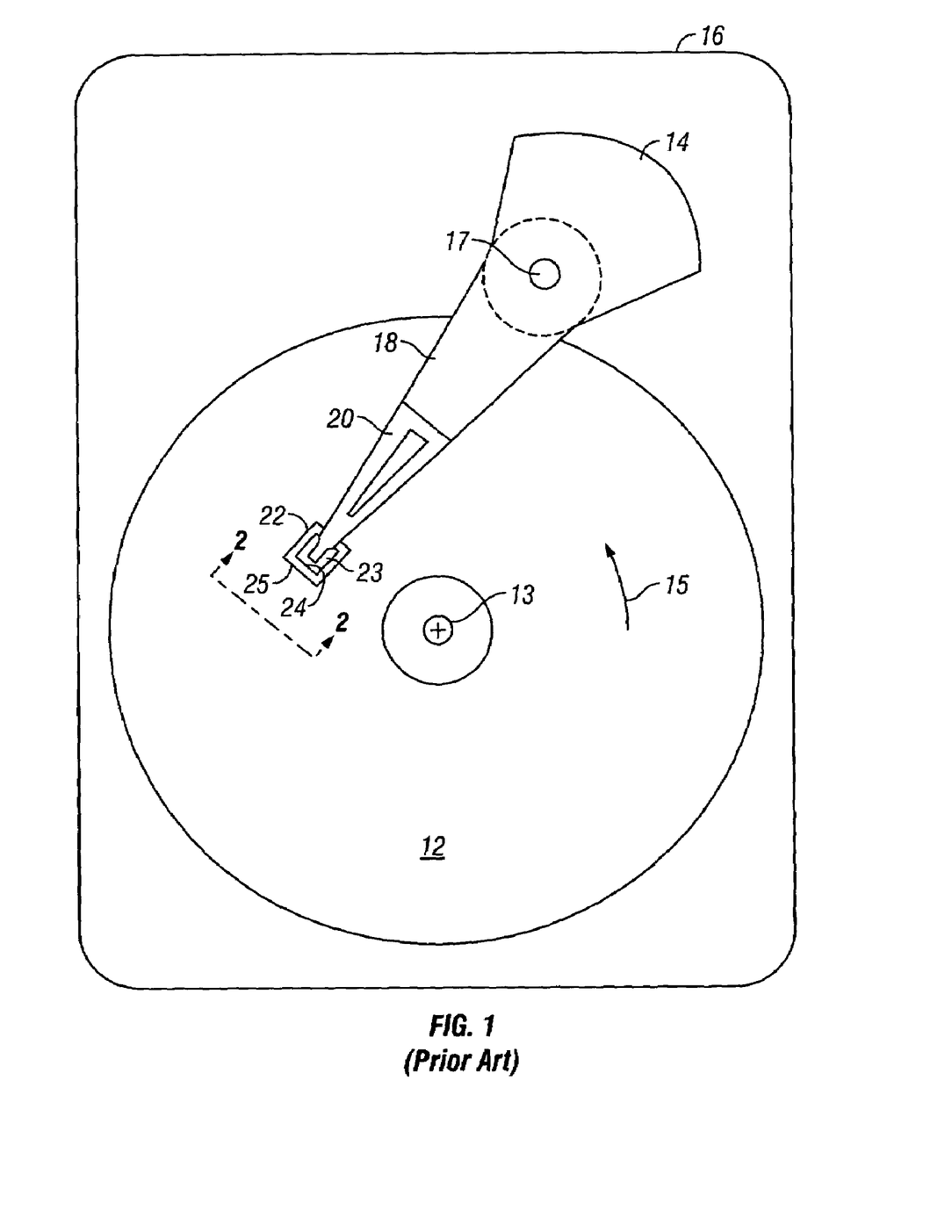
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
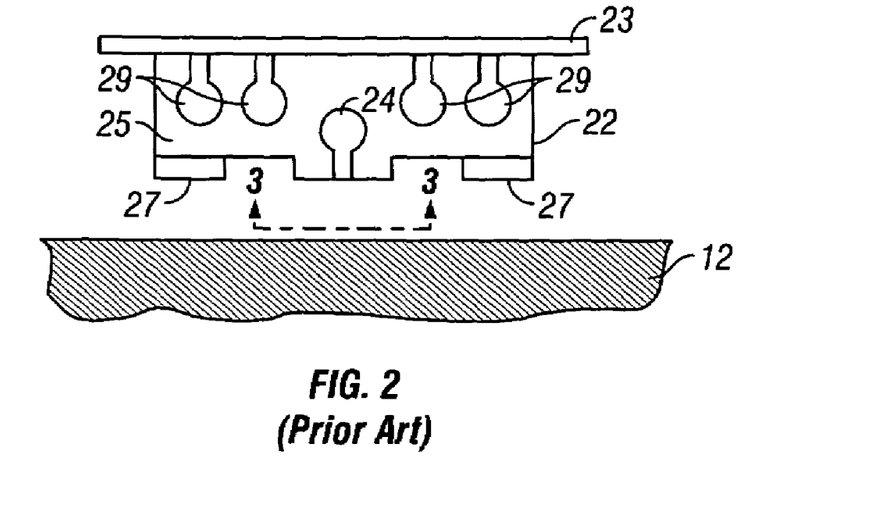
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
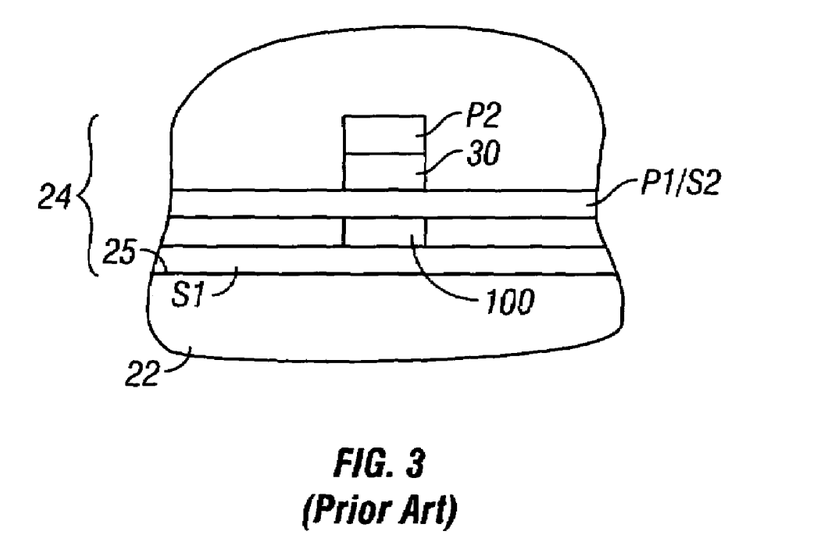
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP-SV magnetoresistive sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
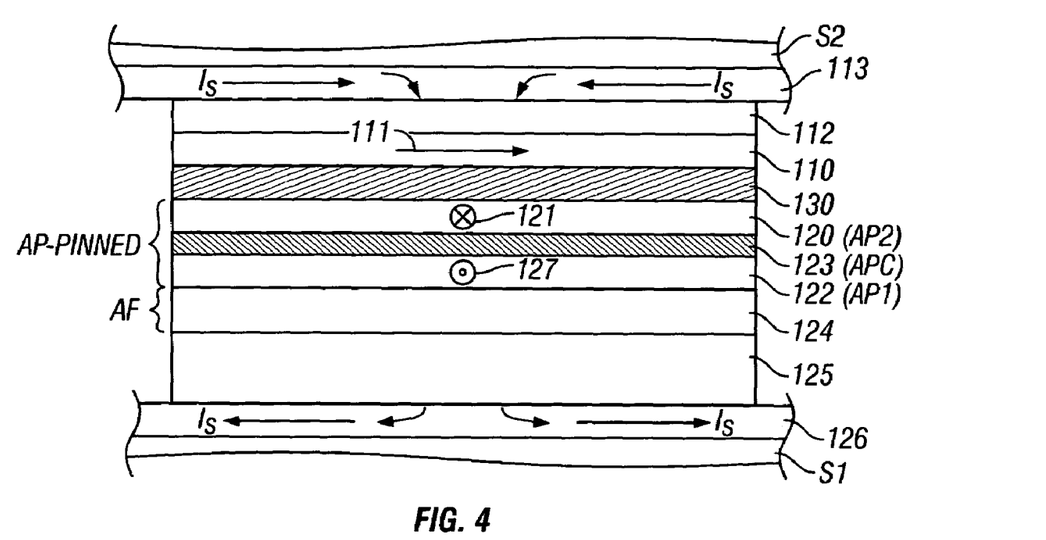
FIG. 4 is a cross-sectional schematic view of a CPP-SV read head showing the stack of layers located between the magnetic shield layers.

FIG. 4 is an enlarged sectional view showing the layers making up sensor 100. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The reference layer 120 is part of the well-known antiparallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower ferromagnetic (AP1) layer 122 that are antiferromagnetically coupled across an AP coupling (APC) layer 123, such as Ru, Ir, Rh, or Cr. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or pinned by a hard magnetic layer such as $Co_{100-x}Pt_x$ or $Co_{100-x-y}Pt_xCr_y$ (where x is between about and 8 and 30 atomic percent). In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar but not equal magnetic moments. This assures that the net magnetic moment of the AP-pinned structure is small so that the effective pinning field of the AF layer 124 or hard magnet pinning layer, which is approximately inversely proportional to the net magnetization of the AP-pinned structure, remains high.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of Co, Fe or Ni, one of their alloys, or a multilayer of these materials, such as a CoFe/NiFe bilayer. A CoFe/NiFe bilayer is often used in the free layer. To obtain a high degree of spin-dependent interface scattering, the AP2 layer can also be laminated, for example a FM/X/FM/ . . . /X/FM laminate, where the ferromagnetic (FM) layers are formed of Co, Fe or Ni, one of their alloys, or a multilayer of these materials, such as a CoFe—NiFe—CoFe trilayer; and the X layers are nonmagnetic layers, typically Cu, Ag, or Au or their alloys, and are thin enough that the adjacent FM layers are ferromagnetically coupled.

For example, AP2 layer 120 may be a CoFe alloy, typically 10 to 30 Å thick, and the free ferromagnetic layer 110 may be a bilayer of a CoFe alloy, typically 10-15 Å thick and formed on the spacer layer 130, with a NiFe alloy, typically 10-30 Å thick, formed on the CoFe layer of the bilayer. The APC layer in the AP-pinned structure is typically Ru or Ir with a thickness between about 4-10 Å.

A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer to locally confine the current path and increase the effective resistivity. A CoFe nano-oxide layer may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. Nano-oxide layers can be formed by oxidizing other materials, e.g., Cu/Al or Cu/Ti alloys or multilayers.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

Figure 5:
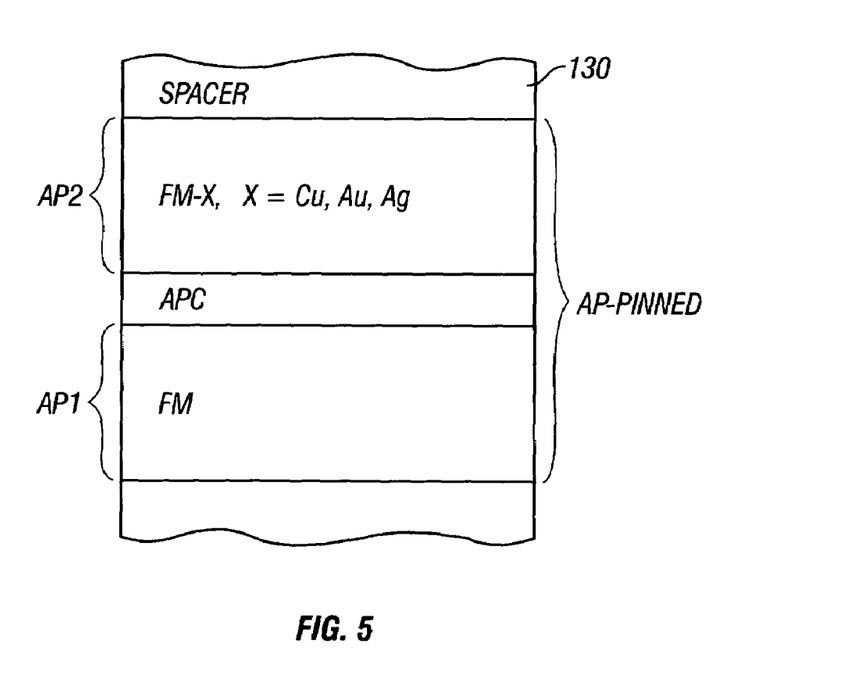
FIG. 5 is a cross-sectional schematic view of the AP-pinned structure of the present invention.

The present invention is the CPP-SV sensor essentially as described above, but with an improved AP-pinned structure. As illustrated in FIG. 5, the AP2 layer comprises a ferromagnetic (FM) material that includes one or more additive elements (X) of Cu, Au and Ag, with the total additive elements being present in the alloy in an amount greater than about 15 atomic percent. If the AP1 layer comprises a CoFe alloy and the AP2 layer comprises a CoFeX alloy, where X is one or more of Cu, Au and Ag, the AP2 layer is then made thicker than the AP1 layer so that they have nearly the same magnetic moments. This is because the additive element or elements will cause the CoFeX alloy to have a lower magnetic moment than a pure CoFe alloy of the same thickness. The thicker AP2 layer allows for more bulk spin-dependent scattering of electrons because it utilizes more of the full spin-diffusion length of the electrons. The increased bulk spin-dependent scattering of electrons increases the magnetoresistance of the read head. In addition, it has been discovered that the use of an AP-pinned structure in a CPP-SV read head causes a decrease in magnetoresistance. This is believed due to spin scattering at the APC and AP1 interfaces and in the bulk of the AP1 layer. Thus the use of a thicker AP2 layer also places the APC and AP1 layers farther from the free layer, which reduces this adverse effect on magnetoresistance.

Figure 6:
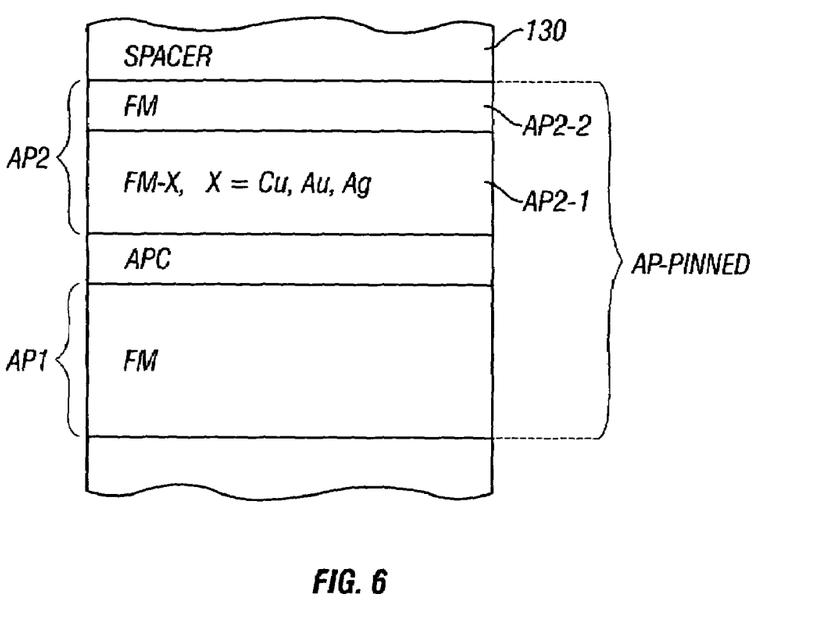
FIG. 6 is a cross-sectional schematic view of another embodiment of the AP-pinned structure of the present invention.

FIG. 6 illustrates an embodiment of the invention where the AP2 layer is a multilayer of a first ferromagnetic film (AP2-1) comprising one or more of the additive elements and a second ferromagnetic film (AP2-2) between and in contact with the first ferromagnetic film and the electrically conducting nonmagnetic spacer layer 130. The second ferromagnetic film in the AP2 layer (AP2-2), for example a CoFe alloy without any additive elements, is typically much thinner than the first film (AP2-1) and is used to insure good interfacial scattering at the spacer layer interface.

Various CPP-SV samples were made and tested with AP2 layers formed of CoFeCu of various thicknesses and Cu concentrations. The basic structure was:

Seed layer: 30 Å Ta/500 Cu
AF layer: 250 Å PtMn
AP1 layer: 30 Å CoFe
APC layer: 8 Å Ru
AP2: Multilayer of CoFeCu/5 Å $Co_{84}Fe_{16}$
Spacer layer: 30 Å Cu
Free layer: Bilayer of 10 Å CoFe/40 Å NiFe
Capping layer: 200 Å Cu/50 Å Ru/25 Å Ta In all samples the AP2 layer included an optional ultrathin 2 Å initial film of just CoFe deposited on the 8 Å Ru APC layer to insure good coupling of the AP1 layer to the AP2 layer. However this layer is not essential. Table 1 below lists the measured CPP-SV sensor ΔR/R values for these samples (Samples 2-4) as compared with a CPP-SV sensor with a conventional CoFe AP2 layer (Sample 1).

TABLE 1

| Sample # | AP2 Layer | ΔR/R (%) |
| --- | --- | --- |
| 1 | 30 Å $Co_{84}Fe_{16}$ | 1.68 |
| 2 | 28 Å $(Co_{90}Fe_{10})_{85}Cu_{15}$/5 Å $Co_{84}Fe_{16}$ | 1.76 |
| 3 | 33 Å $(Co_{90}Fe_{10})_{75}Cu_{25}$/5 Å $Co_{84}Fe_{16}$ | 1.97 |
| 4 | 40 Å $(Co_{90}Fe_{10})_{60}Cu_{40}$/5 Å $Co_{84}Fe_{16}$ | 2.19 |

The AP2 layers of Samples 2-4, even though they are of different thicknesses, all have substantially the same magnetic moment, which is very close to the magnetic moment of the 30 Å $Co_{84}Fe_{16}$ AP1 layer. It is preferred that the AP1 and AP2 layers have about the same magnetic moment.

The invention is also applicable to AP-pinned structures wherein the AP2 layer is a FM/X/FM/ . . . /X/FM laminate. The FM layers would include one or more additive elements of Cu, Au and Ag, with the total additive elements being less than about 10 atomic percent. The X layers are nonmagnetic layers, typically Cu, Ag, or Au or their alloys, and are thin enough that the adjacent FM layers are ferromagnetically coupled. This laminated AP2 layer would have at least two FM layers and one X layer.

While the above samples used Cu as the additive element to the CoFe in the AP2 layer, a similar improvement in ΔR/R would occur with Au or Ag. While only a single additive element, i.e., Cu, Au or Ag, is preferred for ease in fabrication, a similar improvement would occur if two or all three of the additive elements were used, provided the total amount of the additive elements in the CoFeX alloy is greater than about 10 atomic percent. Below a lower limit of about 10 atomic percent for the additive element or elements there is not enough reduction in magnetic moment of the AP2 layer and thus no incentive to increase the thickness of the AP2 layer. The upper limit of the additive element or elements is believed to be about 70 atomic percent because above that amount the magnetic moment of the AP2 layer would be zero at room temperature and above.

The above samples used CoFe as the ferromagnetic material to which the one or more elements of Cu, Au and Ag were added. However, the invention is applicable to other ferromagnetic materials in the AP2 layer, such as any ferromagnetic alloy comprising one or more of Co, Fe and Ni, such as $Co_{50}Fe_{50}$ for increased bulk scattering and CoFeNi for low coercivity.

Figure 7:
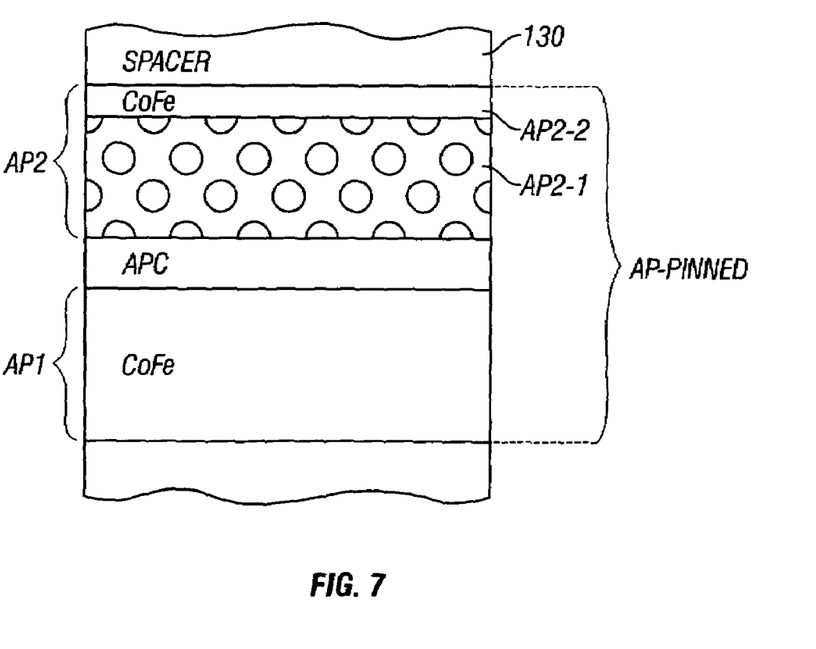
FIG. 7 is a cross-sectional schematic view of the AP-pinned structure of the present invention after annealing.

The above samples were annealed for 5 hours at 245° C. to induce PtMn pinning. However, it is believed that with more annealing more segregation of the ferromagnetic material grains and the additive element grains would occur, resulting in a further improvement to ΔR/R as a result of more interfacial scattering of electrons. FIG. 7 is an illustration of the granular structure of a CoFeCu AP2 layer after annealing, with the circular regions representing Cu grains that serve as sites for additional electron scattering. The typical annealing parameters would be at a temperature in the range of about 300 to 500° C. for a period between about 10 and 600 minutes. For CoFe—Au, this anneal temperature is lower, with some segregation observed at 245° C.

The CPP-SV magnetoresistive sensor with the improved AP-pinned structure may also be a dual spin-valve sensor, like the dual spin-valve structure for use as a CIP-SV sensor described in U.S. Pat. No. 5,287,238. Referring to FIG. 4, such a sensor would have a second electrically conducting nonmagnetic spacer layer (like layer 130) formed on top of free layer 110 and a second pinned layer (like layer 120) on top of the second nonmagnetic spacer layer. The second pinned layer may be an AP-pinned structure according to this invention. Thus a dual CPP-SV sensor according to this invention would have one or both of its pinned layers formed as the above-described improved AP-pinned structure.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing external magnetic fields when a sense current is applied perpendicular to the planes of the layers in the sensor, the sensor comprising:
   a substrate;
   an antiparallel (AP) pinned structure comprising a first AP-pinned ferromagnetic layer (AP1 layer) having an in-plane magnetization direction, a second AP-pinned ferromagnetic layer (AP2 layer) having an in-plane magnetization direction substantially antiparallel to the magnetization direction of the AP1 layer, and an AP coupling (APC) layer between and in contact with the AP1 and AP2 layers, the ferromagnetic AP2 layer comprising a layer of substantially segregated grains of a ferromagnetic material and grains of one or more elements selected from the group consisting of Cu, Au and Ag, wherein the total amount of said one or more elements is greater than about 10 atomic percent;
   a free ferromagnetic layer having an in-plane magnetization direction substantially free to rotate in the presence of an external magnetic field; and
   a spacer layer between the free ferromagnetic layer and the AP2 layer of the AP-pinned structure.

2. The sensor of claim 1 wherein said selected element is Cu.

3. The sensor of claim 2 wherein the AP2 layer comprises a CoFeCu alloy.

4. The sensor of claim 1 wherein the sensor is a dual spin-valve sensor.

5. The sensor of claim 1 wherein the ferromagnetic grains consist essentially of CoFe grains and said selected element grains consist essentially of Cu grains.

6. The sensor of claim 1 wherein the AP2 layer is adjacent to and in contact with the spacer layer.

7. The sensor of claim 1 wherein the AP2 layer comprises a multilayer of a first AP2 film, said first AP2 film being a ferromagnetic layer comprising substantially segregated grains of a ferromagnetic material and one or more elements selected from the group consisting of Cu, Au and Ag, wherein the amount of said one or more elements is greater than about 10 atomic percent; and a second AP2 film consisting essentially of one or more of Co, Fe and Ni, wherein said second AP2 film is between and in contact with said first AP2 film and the spacer layer.

8. The sensor of claim 1 wherein the AP2 layer comprises a laminate of two ferromagnetic layers ferromagnetically coupled across a nonmagnetic layer, each ferromagnetic layer in the AP2 laminate comprising substantially segregated grains of a ferromagnetic material and one or more elements selected from the group consisting of Cu, Au and Ag, wherein the amount of said one or more elements is greater than about 10 atomic percent.

9. The sensor of claim 1 wherein the AP1 layer and the AP2 layer have substantially the same magnetic moment.

10. The sensor of claim 1 wherein the AP-pinned structure is located between the substrate and the free ferromagnetic layer.

11. The sensor of claim 1 wherein the free ferromagnetic layer is located between the substrate and the AP-pinned structure.

12. The sensor of claim 1 wherein the AP-pinned structure is a self-pinned structure.

13. The sensor of claim 1 further comprising an antiferromagnetic layer exchange-coupled to the AP1 layer for pinning the magnetization direction of the AP1 layer.

14. The sensor of claim 1 further comprising a hard magnetic layer in contact with the AP1 layer for pinning the magnetization direction of the AP1 layer.

15. The sensor of claim 1 wherein one or more of the free ferromagnetic layer, the AP2 layer, and the spacer layer further comprises a nano-oxide layer.

16. The sensor of claim 1 wherein the sensor is a magnetoresistive read head for reading magnetically recorded data from tracks on a magnetic recording medium, and wherein the substrate is a first shield formed of magnetically permeable material.

17. A current-perpendicular-to-the-plane magnetoresistive read head for reading magnetically recorded data from tracks on a magnetic recording medium, the head comprising:
   a first shield layer of magnetically permeable material;
   a seed layer on the first shield;
   an antiparallel (AP) pinned structure comprising a first AP-pinned ferromagnetic layer (AP1 layer) on the seed layer and having an in-plane magnetization direction, a second AP-pinned ferromagnetic layer (AP2 layer) having an in-plane magnetization direction substantially antiparallel to the magnetization direction of the AP1 layer, and an AP coupling (APC) layer between and in contact with the AP1 and AP2 layers, the AP2 layer being a material comprising Co, Fe and X, wherein X is an element selected from the group consisting of Cu, Au and Ag and is present in said material in an amount greater than about 10 atomic percent, and wherein the Co, Fe and X are present in the AP2 layer material as substantially segregated grains of CoFe and grains of X;

an electrically conductive nonmagnetic spacer layer on the AP2 layer;

a free magnetic layer on the spacer layer and having an in-plane magnetization direction oriented substantially orthogonal to the magnetization directions of the AP1 and AP2 layers in the absence of an external magnetic field;

a capping layer on the free ferromagnetic layer; and a second shield layer of magnetically permeable material on the capping layer.

18. The head of claim 17 wherein one or more of the free ferromagnetic layer, the AP2 layer, and the conductive nonmagnetic spacer layer further comprises a nano-oxide layer.

19. The head of claim 17 wherein the head is a dual spin-valve head.

20. The head of claim 17 wherein X is Cu.

21. The head of claim 17 wherein the AP2 layer comprises a multilayer of a first ferromagnetic AP2 film, said first AP2 film being a material comprising Co, Fe and X wherein the Co, Fe and X are present in said first AP2 film as substantially segregated grains of CoFe and grains of X, and a second ferromagnetic AP2 film consisting essentially of one or more of Co, Fe and Ni, wherein said second AP2 film is between and in contact with said first AP2 film and the spacer layer.

22. The head of claim 17 wherein the AP2 layer comprises a laminate of two ferromagnetic layers ferromagnetically coupled across a nonmagnetic layer, each ferromagnetic layer in the AP2 laminate comprising Co, Fe and X wherein the Co, Fe and X are present in each ferromagnetic layer in the AP2 laminate as substantially segregated grains of CoFe and grains of X.

23. The head of claim 17 wherein the AP1 layer and the AP2 layer have substantially the same magnetic moment.

24. The head of claim 17 wherein the AP-pinned structure is a self-pinned structure.

25. The head of claim 17 further comprising an antiferromagnetic layer exchange-coupled to the AP1 layer for pinning the magnetization direction of the AP1 layer.

26. The head of claim 17 further comprising a hard magnetic layer in contact with the AP1 layer for pinning the magnetization direction of the AP1 layer.

* * * * *